United States Patent
Asada et al.

(10) Patent No.: US 12,133,468 B2
(45) Date of Patent: Oct. 29, 2024

(54) ULTRASONIC WAVE GENERATION DEVICE WITH LOW PROFILE

(71) Applicant: Murata Manufacturing Co., Ltd., Nagaokakyo (JP)

(72) Inventors: Takaaki Asada, Nagaokakyo (JP); Motonori Nakamura, Nagaokakyo (JP); Shinichi Sasaki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 658 days.

(21) Appl. No.: 17/473,221

(22) Filed: Sep. 13, 2021

(65) Prior Publication Data

US 2021/0408363 A1    Dec. 30, 2021

Related U.S. Application Data

(63) Continuation of application No. PCT/JP2020/009292, filed on Mar. 5, 2020.

(30) Foreign Application Priority Data

Mar. 14, 2019    (JP) ................. 2019-047399

(51) Int. Cl.
*H10N 30/20*      (2023.01)
*H10N 30/87*      (2023.01)
(Continued)

(52) U.S. Cl.
CPC ............ *H10N 30/20* (2023.02); *H10N 30/87* (2023.02); *H10N 30/88* (2023.02); *H04R 17/00* (2013.01)

(58) Field of Classification Search
CPC ........ H10N 30/20; H10N 30/87; H10N 30/88; H10N 30/204; H04R 17/00; H04R 1/345; H04R 7/02; H04R 2217/03; B06B 1/0603
See application file for complete search history.

(56) References Cited

U.S. PATENT DOCUMENTS

| 4,333,028 A | 6/1982 | Panton |
| 6,087,760 A * | 7/2000 | Yamaguchi ............ G10K 9/122 310/334 |

(Continued)

FOREIGN PATENT DOCUMENTS

| JP | 2006165923 A | 6/2006 |
| JP | 2007060346 A | 3/2007 |

(Continued)

OTHER PUBLICATIONS

Barone, A. et al.: "Flexural Vibrating Free-Edge Plates with Stepped Thicknesses for Generating High Directional Ultrasonic Radiation"; The Journal of the Acoustical Society of America, vol. 51, No. 3 (part 2), Mar. 1, 1972, pp. 953-959.

(Continued)

*Primary Examiner* — Emily P Pham
(74) *Attorney, Agent, or Firm* — ArentFox Schiff LLP

(57) ABSTRACT

A low-profile ultrasonic wave generation device is provided that includes a drive unit having a piezoelectric member and an electrode formed on a surface of the piezoelectric member. The drive unit as a whole vibrates flexurally. The connection member is connected to a portion of the drive unit that includes a point of maximum displacement of the drive unit when the drive unit is subjected to flexural vibration. The vibrating unit is connected to the connection member. The vibrating unit vibrates due to the flexural vibration of the drive unit being transmitted by the connection member and thereby generates ultrasonic waves.

20 Claims, 4 Drawing Sheets

(51) Int. Cl.
*H10N 30/88* (2023.01)
*H04R 17/00* (2006.01)

(56) References Cited

U.S. PATENT DOCUMENTS

| | | | |
|---|---|---|---|
| 7,902,968 B2 * | 3/2011 | Kojima | ............... G10K 11/004 |
| | | | 73/632 |
| 2001/0033669 A1 | 10/2001 | Bank et al. | |
| 2013/0028055 A1 | 1/2013 | Lee et al. | |
| 2018/0035200 A1 | 2/2018 | Abe et al. | |

FOREIGN PATENT DOCUMENTS

| | | | |
|---|---|---|---|
| JP | 2007215119 A | | 8/2007 |
| JP | 2013183384 A | | 9/2013 |
| JP | 2017049042 A | | 3/2017 |
| KR | 100774516 B1 | | 11/2007 |
| WO | 2017029768 A1 | | 2/2017 |

OTHER PUBLICATIONS

Otsuka, T. et al.; "High Power Aerial Ultrasound Source with Stepped Circular Vibrating Plate"; Journal of the Acoustical Society of Japan, 1991, vol. 47, No. 7, pp. 478-483. (this npl is described in specification).
International Search Report issued in PCT/JP2020/009292, dated May 26, 2020.
Written Opinion of the International Search Report issued in PCT/JP2020/009292, dated May 26, 2020.

* cited by examiner

θ (0deg to 360deg)

ULTRASONIC WAVE GENERATION DEVICE WITH LOW PROFILE

CROSS REFERENCE TO RELATED APPLICATIONS

The present application is a continuation of PCT/JP2020/009292 filed Mar. 5, 2020, which claims priority to Japanese Patent Application No. 2019-047399, filed Mar. 14, 2019, the entire contents of each of which are incorporated herein by reference.

TECHNICAL FIELD

The present disclosure relates to an ultrasonic wave generation device.

BACKGROUND

Currently, a stepped circular vibrating plate having steps can be used as a source of airborne ultrasonic waves. For example, Non Patent Document 1 (listed below) describes such a technology, in which the steps are disposed on a flat circular vibrating plate at positions between nodes in the amplitude distribution generated in the vibrating plate. Moreover, the height of each step is set to be a half-wavelength of the airborne ultrasonic wave.

Non Patent Document 1: Otsuka, T; Seya, K. "High Power Aerial Ultrasound Source with Stepped Circular Vibrating Plate", Journal of the Acoustical Society of Japan, 1991, Vol 47, No. 7, pp. 478-483

The device described in Non Patent Document 1 uses a Langevin transducer as an ultrasonic oscillator. Accordingly, the device inevitably becomes tall, of which limitation of size reduction of the device narrows the range of application of the device.

SUMMARY OF THE INVENTION

The present disclosure provides a low-profile ultrasonic wave generation device.

In particular, an exemplary embodiment of the present disclosure provides an ultrasonic wave generation device that includes a drive unit and a connection member. The drive unit has a piezoelectric member and an electrode formed on a surface of the piezoelectric member. The drive unit is constructed as a whole to vibrate flexurally. The connection member is connected to a portion of the drive unit. The portion of the drive unit to which the connection member is connected includes a point of maximum displacement of the drive unit when the drive unit is subjected to flexural vibration. The vibrating unit is connected to the connection member. The vibrating unit vibrates due to the flexural vibration of the drive unit being transmitted by the connection member and thereby generates ultrasonic waves.

According to the present disclosure, an ultrasonic wave generation device is provided with reduced height compared with conventional designs.

DETAILED DESCRIPTION OF EMBODIMENT

Figure 1:
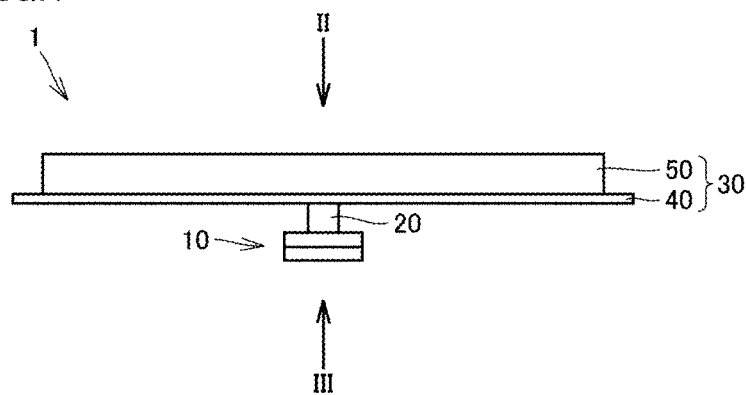
FIG. 1 is a front view illustrating an ultrasonic wave generation device according to an exemplary embodiment.

An exemplary embodiment of the present invention will be described with reference to the drawings. It is noted that the same or equivalent elements are denoted by the same reference signs in the drawings, and duplicated descriptions will be omitted.

Figure 2:
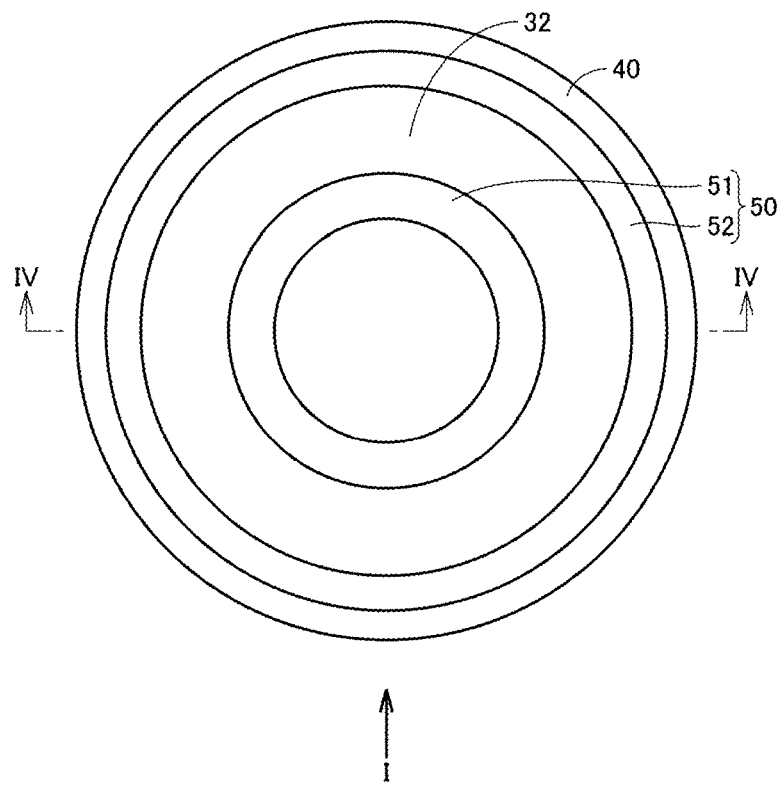
FIG. 2 is a plan view illustrating the ultrasonic wave generation device of FIG. 1.
Figure 3:
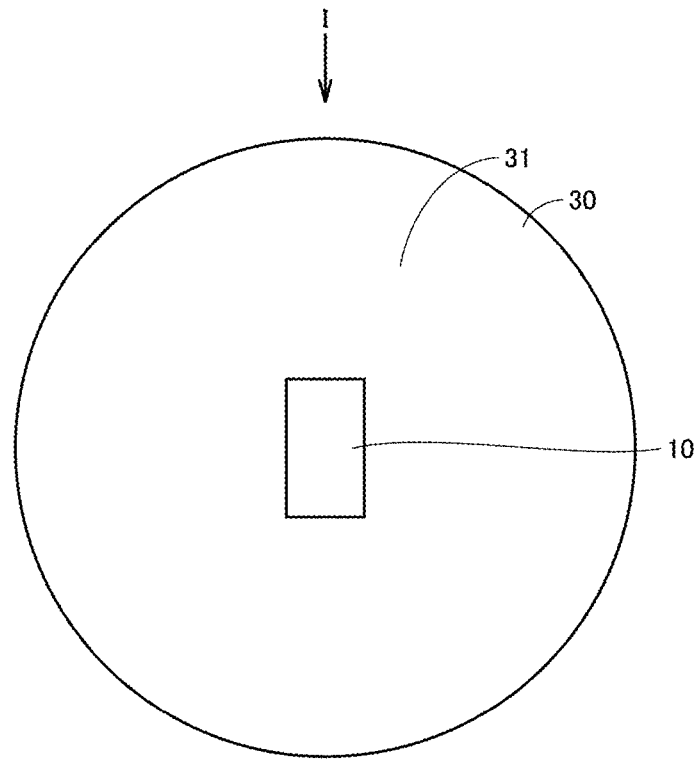
FIG. 3 is a bottom view illustrating the ultrasonic wave generation device of FIG. 1.
Figure 4:
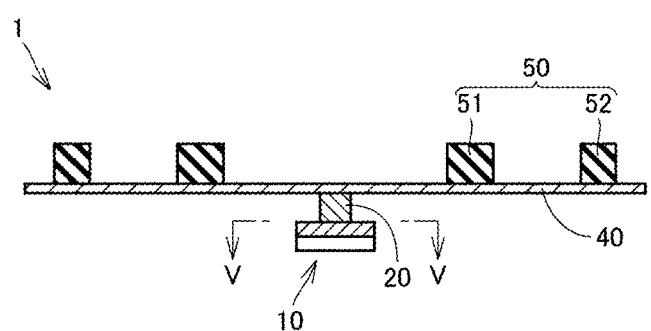
FIG. 4 is a cross section of the ultrasonic wave generation device taken along line IV-IV in FIG. 2.

FIG. 1 is a front view illustrating an ultrasonic wave generation device 1 according to an exemplary embodiment. FIG. 2 is a plan view illustrating the ultrasonic wave generation device 1 of FIG. 1. FIG. 3 is a bottom view illustrating the ultrasonic wave generation device 1 of FIG. 1. FIG. 4 is a cross section of the ultrasonic wave generation device 1 taken along line IV-IV in FIG. 2. Note that the ultrasonic wave generation device 1 illustrated in FIG. 1 is viewed in the direction of arrow I in FIG. 2, in other words, viewed in the direction of arrow I in FIG. 3. The ultrasonic wave generation device 1 illustrated in FIG. 2 is viewed in the direction of arrow II in FIG. 1. The ultrasonic wave generation device 1 illustrated in FIG. 3 is viewed in the direction of arrow III in FIG. 1.

As illustrated in FIGS. 1 to 4, the ultrasonic wave generation device 1 includes a drive unit 10, a connection member 20, and a vibrating unit 30.

Figure 5:
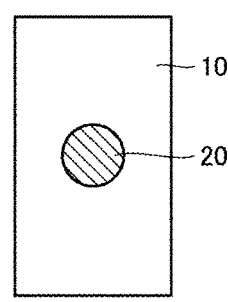
FIG. 5 is a cross section of the ultrasonic wave generation device taken along line V-V in FIG. 4.

The drive unit 10 is constructed to generate flexural vibrations. The connection member 20 is connected to a portion of the drive unit 10. FIG. 5 is a cross section of the ultrasonic wave generation device 1 taken along line V-V in FIG. 4. As shown, the drive unit 10 can be shaped like a rectangle as viewed in the thickness direction. The connection member 20 has a round bar-like shape. The connection member 20 illustrated in FIG. 5 entirely overlaps the drive unit 10. When the drive unit 10 is viewed in the thickness direction, the length across the connection member 20 is smaller than the length across the drive unit 10. In other words, as illustrated in FIG. 5, the diameter of the circle, which is the cross section of the connection member 20, is smaller than the length of each short side of the rectangular drive unit 10. The connection member 20 is connected to a portion of the drive unit 10. Moreover, the entire bottom end of the connection member 20 is connected to the drive unit 10. However, in the exemplary aspect, the surface of the drive unit 10 is not entirely connected to the connection member 20. In other words, the surface of the drive unit 10 includes a portion connected to the connection member 20 and a portion not connected to the connection member 20 as shown in FIG. 5, for example.

The connection member 20 has the round bar-like shape, and the position of the connection member 20 relative to the drive unit 10 as illustrated in FIG. 5 is the position at which the connection member 20 is connected to the drive unit 10. The connection member 20 is connected to a central portion of the rectangular shaped drive unit 10. The portion of the drive unit 10 to which the connection member 20 is connected includes the center of the drive unit 10. In other words, the portion of the drive unit 10 to which the connection member 20 is connected includes the point at which two diagonals of the rectangular shaped drive unit 10 intersect each other.

Figure 6:
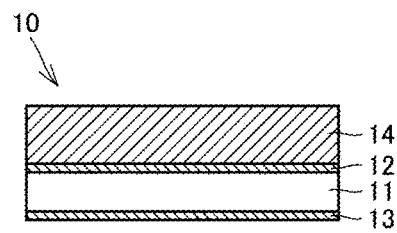
FIG. 6 is an enlarged cross-sectional view illustrating a drive unit.

FIG. 6 is an enlarged cross-sectional view illustrating the drive unit 10. As illustrated in FIG. 6, the drive unit 10 includes a piezoelectric member 11, electrodes 12 and 13, and a support plate 14. The electrodes 12 and 13 are formed at upper and lower portions of the piezoelectric member 11. Moreover, the piezoelectric member 11 has a surface on which the electrode 12 is formed and the other surface on which the electrode 13 is formed. A piezoelectric element is formed of the piezoelectric member 11 and two sheets of electrodes 12 and 13 that sandwich the piezoelectric member 11 in between. In an exemplary aspect, the drive unit 10 is formed by adhering the support plate 14 to the piezoelectric element.

The piezoelectric member 11 is preferably made of a material that has a large absolute value of piezoelectric constant d31, in other words, that can bring about a large piezoelectric transverse effect, which thereby readily induces flexural vibration of the drive unit 10. For example, the material of the piezoelectric member 11 may be a piezoelectric ceramic material, such as titanate zirconate (PZT), but can be other materials in alternative aspects and is not so limited.

The support plate 14 is preferably made of a material that is light-weight and has a high Young's modulus. The material of the support plate 14 may be resin or wood. It is desirable, however, that the support plate 14 be made of a metallic material, such as aluminum as a typical example, which leads to less energy loss. The piezoelectric member 11 and the support plate 14 may have different thicknesses (different dimensions in the up-down direction in FIG. 6).

When a voltage is applied to the piezoelectric member 11, the piezoelectric member 11 expands or contracts due to the piezoelectric transverse effect. On the other hand, the support plate 14 fixed to the piezoelectric element does not follow the deformation of the piezoelectric member 11. The deformation of the support plate 14 is smaller than the deformation of the piezoelectric member 11, which causes the drive unit 10 as a whole to bend.

When the direction of the voltage applied to the piezoelectric member 11 is reversed, the drive unit 10 bends in the opposite direction. More specifically, when the voltage is applied in the same direction as the polarization direction of the piezoelectric member 11, the piezoelectric member 11 expands, and the drive unit 10 as a whole bends in a downward-convex shape. When the voltage is applied in the direction opposite to the polarization direction of the piezoelectric member 11, the piezoelectric member 11 contracts, and the drive unit 10 as a whole bends in an upward-convex shape. According to this configuration, the drive unit 10 generates flexural vibration in such a manner.

Accordingly, the central portion of the drive unit 10 to which the connection member 20 is connected includes a point of maximum displacement of the drive unit 10 that is displaced by the flexural vibration. The connection member 20 is connected to the point of maximum displacement at which the displacement of the drive unit 10 becomes maximum when the drive unit 10 is subjected to flexural deformation.

It is noted that the electrode 12 is not an indispensable component for applying voltage to the piezoelectric member 11. Voltage can be applied to the piezoelectric member 11 by generating potential difference between the electrode 13 and the support plate 14 that is made of a metallic material in an alternative aspect.

Moreover, the drive unit 10 illustrated in FIG. 6 has a monolayer structure having only one piezoelectric member 11. The drive unit 10, however, is not limited to this configuration and may include two piezoelectric members laminated on each other. When voltages with opposite directions are applied to respective piezoelectric members, the piezoelectric members bend in opposite directions, which can generate flexural vibration of the drive unit 10 as a whole. This configuration can increase the amount of displacement of the drive unit 10 due to flexural vibration. In other words, this configuration increases the amplitude of the flexural vibration.

The drive unit 10 illustrated in FIG. 5 has a rectangular shape as viewed in the thickness direction thereof. The drive unit 10, however, may have other shapes, such as a square-like shape or a circular shape in alternative aspects. The portion of the drive unit 10 to which the connection member 20 is connected is not necessarily limited to the central portion thereof. In the case of the point of maximum displacement in flexural vibration being located at the central portion of the drive unit 10, it is desirable to connect the connection member 20 to the central portion of the drive unit 10. On the other hand, in the case of the point of maximum displacement being shifted from the central portion of the drive unit 10 depending on a mode of flexural vibration or on a supporting configuration of the drive unit 10, it is desirable to connect the connection member 20 to a portion that includes the maximum displacement point.

Moreover, the connection member 20 is preferably made of a light-weight material having a high Young's modulus. For example, the material of the connection member 20 may be a metallic material, such as aluminum as a typical example.

As shown, the entire top end of the connection member 20 is connected to the vibrating unit 30. The flexural vibration of the drive unit 10 is transmitted to the vibrating unit 30 by the connection member 20, which causes the vibrating unit 30 to vibrate. As a result, the vibration of the vibrating unit 30 generates ultrasonic waves.

According to the exemplary embodiment, the vibrating unit 30 has a first surface 31 illustrated in FIG. 3 and a second surface 32 illustrated in FIG. 2. The first surface 31 is the surface of the vibrating unit 30 to which the connection member 20 is connected. The second surface 32 is the surface of the vibrating unit 30 that is opposite to the first surface 31 and that the connection member 20 is not connected to. The top end of the connection member 20 is connected to the central portion of the first surface 31 of the vibrating unit 30.

As illustrated in FIGS. 1 to 4, the vibrating unit 30 includes a flat plate 40 and a directing member 50 disposed thereon. In the present embodiment, the flat plate 40 has a disc-like shape. The directing member 50 includes convex rings 51 and 52 that are formed like stubbed cylinders. The convex rings 51 and 52 are disposed concentrically. The disc-like flat plate 40 is also disposed concentrically with the convex rings 51 and 52. The convex ring 51 and the convex ring 52 form concentric circles. The convex ring 51 is smaller in diameter than the convex ring 52. Thus, the outer diameter of the convex ring 51 is smaller than the inner diameter of the convex ring 52.

As illustrated in FIGS. 1, 3, and 4, the first surface 31 of the vibrating unit 30 is the bottom surface of the flat plate 40. As illustrated in FIGS. 1, 2, and 4, the second surface 32 of the vibrating unit 30 is formed by the top surface of the flat plate 40 and the directing member 50, in other words, the convex rings 51 and 52. As illustrated in FIG. 4, protrusions and depressions are formed on the second surface 32 of the vibrating unit 30. Referring also to FIG. 2, the protrusions and depressions are disposed concentrically on the second surface 32 of the vibrating unit 30. The protrusions and depressions are formed on the second surface 32 of the vibrating unit 30 by attaching the directing member 50 (i.e., convex rings 51 and 52) to the flat upper surface of the planar flat plate 40. The convex rings 51 and 52 attached to the upper surface of the flat plate 40 are configured as the protrusions, and the portions of the upper surface of the flat plate 40 where the convex rings 51 and 52 are not present are configured as the depressions.

According to the exemplary aspect, the directing member 50 is formed as a body separated from the flat plate 40. The directing member 50 is fixed to the flat plate 40 in any arbitrary manner, such as adhesion for example, which thereby combines the directing member 50 and the flat plate 40 into one body and forms the vibrating unit 30 having a one-body structure.

Moreover, the flat plate 40 is preferably made of a light-weight material having a high Young's modulus. For example, the material of the flat plate 40 may be a metallic material, such as aluminum as a typical example. The flat plate 40 is desirably thin so that the flat plate 40 can vibrate easily.

Moreover, the directing member 50 is preferably made of a light-weight and high Young's modulus material that does not disturb the vibration of the flat plate 40. For example, the material of the directing member 50 may be a resin, such as polyurethane as a typical example.

In one exemplary aspect, the flat plate 40 and the directing member 50 may be made of the same material. The flat plate 40 and the directing member 50 may be formed integrally by machining a piece of a metallic material, such as aluminum for example.

The flat plate 40 illustrated in FIGS. 2 and 3 has a circular shape as viewed in the thickness direction. The flat plate 40 may have other shapes, such as a square-like shape or a rectangular shape. It is noted that the shape of the connection member 20 connected to the flat plate 40 is not necessarily limited to the round bar-like shape. When the flat plate 40 has the circular shape, the connection member 20 desirably has a columnar shape, whereas when the flat plate 40 has a rectangular shape, the connection member 20 preferably has a prismatic shape. Thus, in an exemplary aspect, the connection member 20 and the flat plate 40 may have shapes similar to each other as viewed in the thickness direction of the drive unit 10 or the flat plate 40.

The connection member 20 preferably has such a length (i.e., the dimension in the up-down direction in FIGS. 1 and 4) that does not interfere with the vibration of the vibrating unit 30. For example, the length of the connection member 20 may be greater than a half of the amplitude of vibration of the vibrating unit 30 to which the flexural vibration of the drive unit 10 is transmitted by the connection member 20.

The length of the connection member 20 may be several micrometers greater than a half of the amplitude of vibration of the vibrating unit 30.

It is noted that the portion of the vibrating unit 30 to which the connection member 20 is connected is not necessarily limited to the central portion of the vibrating unit 30. The connection member 20 as a whole may be shaped like a funnel, and the circular skirt of the funnel may be connected to a circularly shaped node of vibration of the vibrating unit 30. Accordingly, the connection member 20 does not necessarily have a columnar or bar-like shape. The connection member 20 has the lower end connected to the drive unit 10 and the upper end connected to the vibrating unit 30. The connection member 20, however, is not limited to this configuration, and can have any arbitrary shape that can transmit the flexural vibration of the drive unit 10 to the vibrating unit 30.

Figure 7:
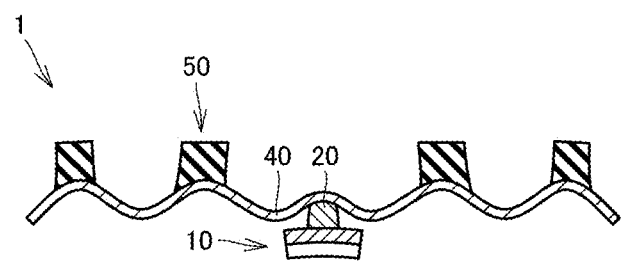
FIG. 7 is a view schematically illustrating the ultrasonic wave generation device when it is vibrating.

FIG. 7 is a view schematically illustrating the ultrasonic wave generation device 1 when it is vibrating. As described above, the vibrating unit 30 vibrates due to the flexural vibration of the drive unit 10 being transmitted to the vibrating unit 30 by the connection member 20. The vibrating unit 30 vibrates in resonance with the vibration of the connection member 20. The vibration of the vibrating unit 30 generates ultrasonic waves.

As illustrated in FIG. 7, an antinode of vibration is positioned at the central portion of the vibrating unit 30 to which the connection member 20 is connected. In the vibrating unit 30, nodes and antinodes of vibration occur alternately and concentrically around the central portion that the connection member 20 is connected to. In FIG. 7, upward-convex portions of the flat plate 40 are odd number antinodes when antinodes are numbered from the central portion to the peripheral portion of the flat plate 40 with the central portion connected to the connection member 20 being numbered one. In FIG. 7, downward-convex portions of the flat plate 40 are even number antinodes when antinodes are numbered from the central portion to the peripheral portion of the flat plate 40 with the central portion connected to the connection member 20 being numbered one.

Moreover, the protrusions are formed on the second surface 32 of the vibrating unit 30 at the odd number antinode positions when the antinodes are numbered from the antinode position at which the connection member 20 is connected to the vibrating unit 30. In other words, the convex rings 51 and 52 are fixed to the flat plate 40 at the odd number antinode positions when the antinodes are numbered from the central portion of the vibrating unit 30. The protrusions are formed on the second surface 32 at alternate antinode positions. In the exemplary aspect, the height of the convex rings 51 and 52 protruding from the upper surface of the flat plate 40 is approximately a half-wavelength of ultrasonic wave generated by the vibrating unit 30.

Due to the protrusions being formed on the vibrating unit 30 as described above, the phase of the ultrasonic wave emitted from each antinode of vibration at which the protrusion is formed is thereby shifted by a half-wavelength from the phase of the ultrasonic wave emitted by the antinode of vibration when the protrusion is not formed. This phase shift enables ultrasonic waves emitted from different antinodes of vibration to become in phase with each other. This configuration reduces the likelihood that the phase difference between ultrasonic waves emitted from adjacent antinodes affects directional characteristics of ultrasonic waves. As a result, unidirectional characteristics are imparted to the ultrasonic wave generation device 1.

To make the above phase shift effective, the dimension of each of the convex rings 51 and 52 in the radial direction (i.e., the dimension in the right-left direction in FIG. 7) is set to be equal to or less than the distance between adjacent nodes of vibration of the flat plate 40.

Figure 8:
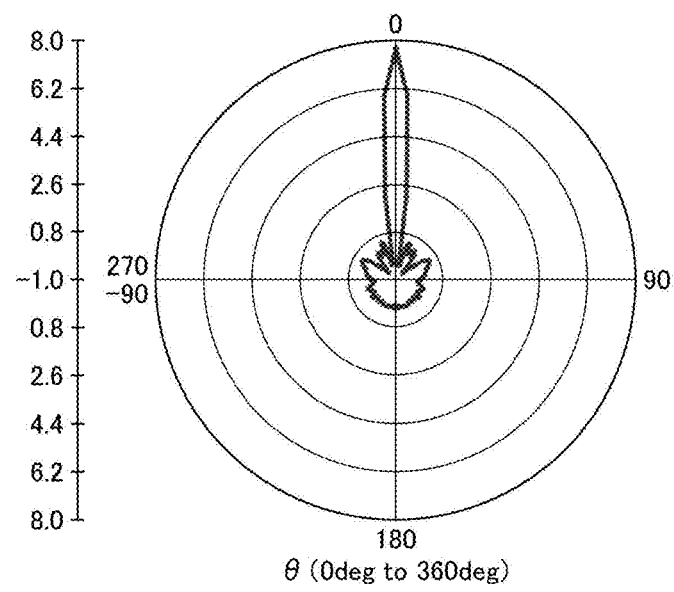
FIG. 8 is a view depicting directivity of sound pressure of the ultrasonic wave generation device according to the exemplary embodiment.

FIG. 8 is a view depicting directivity of sound pressure of the ultrasonic wave generation device 1 according to the embodiment. As illustrated in FIG. 8, due to the directing member 50 imparting directivity to ultrasonic waves, the ultrasonic wave generation device 1 can exhibit favorable directional characteristics in a direction around zero degrees. Thus, the ultrasonic wave generation device 1 is constructed to emit a high-pressure sound in a direction around zero degrees can be provided.

Figure 9:
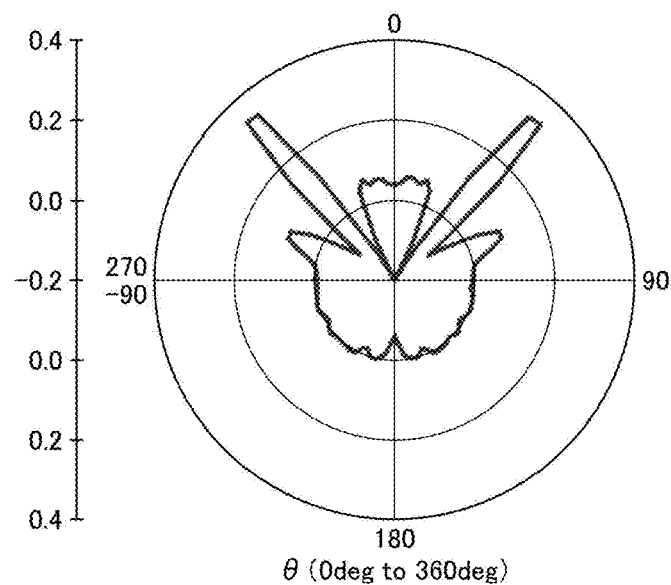
FIG. 9 is a view depicting the directivity of sound pressure of the ultrasonic wave generation device that does not include a directing member.

FIG. 9 is a view depicting the directivity of sound pressure of the ultrasonic wave generation device 1 that does not include the directing member 50. In the ultrasonic wave generation device 1 having no directing member 50, ultrasonic waves emitted from adjacent antinodes of vibration are in opposite phase, and the phase difference thereby affects the directional characteristics. As opposed to the case in FIG. 8, the ultrasonic wave generation device 1 cannot have favorable directivity in a direction around zero degrees. It is possible to impart directivity to ultrasonic waves by providing a reflective plate outside the ultrasonic wave generation device 1 and by reflecting the ultrasonic waves emitted from the ultrasonic wave generation device 1, but this leads to an increase in height of the device.

In the present embodiment, however, the ultrasonic wave generation device 1 includes the directing member 50, and the vibrating unit 30 is configured to have the protrusions and depressions on the second surface 32, which leads to height reduction of the ultrasonic wave generation device 1. Moreover, this configuration reduces the number of components of the ultrasonic wave generation device 1, which leads to cost reduction.

Figure 10:
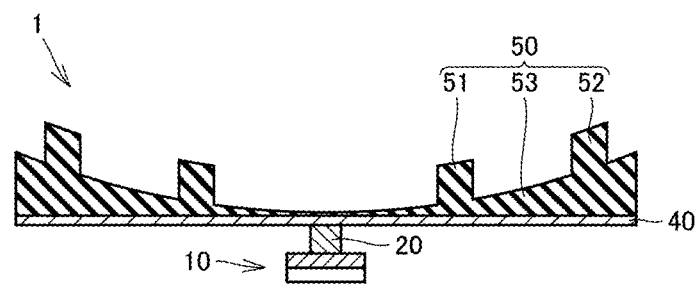
FIG. 10 is a cross-sectional view illustrating the ultrasonic wave generation device that includes a directing member according to a first modification of the exemplary embodiment.

FIG. 10 is a cross-sectional view illustrating the ultrasonic wave generation device 1 that includes a directing member 50 according to a first modification of the exemplary embodiment. The above description of the embodiment has focused on an example of the ultrasonic wave generation device 1 equipped with the vibrating unit 30 that includes the disc-like flat plate 40 and the directing member 50 having the convex rings 51 and 52. On the other hand, the directing member 50 illustrated in FIG. 10 includes a concave portion 53 in addition to the convex rings 51 and 52.

The concave portion 53 has a smoothly curved surface, of which a spherically shaped surface is a typical example. The convex rings 51 and 52 protrude from the surface of the concave portion 53. The height of the convex rings 51 and 52 protruding from the concave portion 53 is approximately a half-wavelength of the ultrasonic wave generated by the vibrating unit 30.

Due to the concave portion 53 included in the directing member 50, the entire second surface 32 of the vibrating unit 30 is formed concavely so that the peripheral portion of the second surface 32 protrudes more than the central portion. This configuration enables ultrasonic waves generated by the vibrating unit 30 to converge into a focus. Accordingly, a greater sound pressure can be obtained at the focus. The position of the focus can be set arbitrarily by appropriately adjusting the curvature of the concave portion 53.

Figure 11:
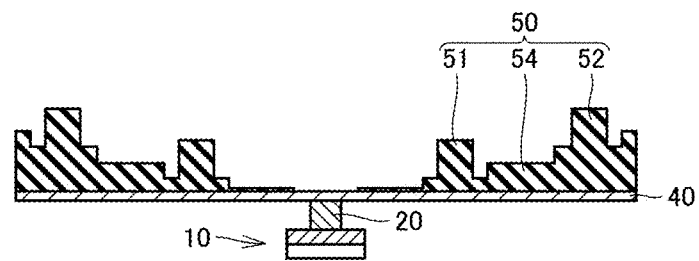
FIG. 11 is a cross-sectional view illustrating the ultrasonic wave generation device that includes a directing member according to a second modification of the exemplary embodiment.

FIG. 11 is a cross-sectional view illustrating the ultrasonic wave generation device 1 that includes a directing member 50 accordingly to a second modification example. The directing member 50 illustrated in FIG. 11 includes a stepped portion 54 provided in place of the concave portion 53. In other words, the directing member 50 illustrated in FIG. 11 includes the convex rings 51 and 52 and the stepped portion 54. The convex rings 51 and 52 protrude from the stepped portion 54. The height of the convex rings 51 and 52 protruding from the stepped portion 54 is approximately a half-wavelength of the ultrasonic wave generated by the vibrating unit 30. The stepped portion 54 has multiple steps formed at the second surface 32 of the vibrating unit 30, and respective heights of the multiple steps from the upper surface of the flat plate 40 are set to become greater from the central portion of the second surface 32 toward the peripheral portion.

Due to the stepped portion 54 included in the directing member 50, the entire second surface 32 of the vibrating unit 30 is formed concavely so that the peripheral portion of the second surface 32 protrudes more than the central portion. This configuration enables ultrasonic waves generated by the vibrating unit 30 to converge into a focus. Accordingly, a greater sound pressure can be obtained at the focus. The position of the focus can be set arbitrarily by appropriately adjusting the heights and the number of the steps of the stepped portion 54.

Next, advantageous effects of the ultrasonic sound generation device 1 of the present embodiment will be described.

As illustrated in FIG. 7, the ultrasonic wave generation device 1 of the present embodiment includes the drive unit 10 that is constructed to entirely vibrate flexurally. The drive unit 10 is set into flexural vibration using the piezoelectric member 11 as an ultrasonic oscillator, which replaces the conventional Langevin transducer. Adopting the low-profile drive unit 10 as the source of vibration leads to a reduction in the height of the entire device compared with known ones. Accordingly, the ultrasonic wave generation device 1 of the present embodiment enables height reduction compared with conventional designs.

Moreover, the drive unit 10 is not connected directly to the vibrating unit 30, but the connection member 20 is interposed between the drive unit 10 and the vibrating unit 30. In addition, the connection member 20 is connected to the portion of the drive unit 10 that includes the point of maximum displacement of the drive unit 10 that vibrates flexurally. This configuration concentrates the energy of flexural vibration of the drive unit 10 onto the connection member 20, which enables efficient transmission of vibration to the vibrating unit 30. Thus, the low-profile ultrasonic wave generation device 1 that produces high sound pressure can be provided.

As illustrated in FIGS. 2 and 4, the protrusions and depressions are concentrically formed on the second surface 32 of the vibrating unit 30. This configuration imparts directivity to the ultrasonic waves generated by the vibrating unit 30 and thereby improves the directional characteristics of the ultrasonic wave generation device 1. Advantageously, the ultrasonic wave generation device 1 does not require an additional component, such as a reflective plate, for adjusting the directional characteristics, which leads to a reduction in the height and size of the ultrasonic wave generation device 1.

As illustrated in FIG. 7, the convex rings 51 and 52 are formed on the second surface 32 of the vibrating unit 30 at the odd number antinode positions when the antinodes are numbered from the antinode position at which the connection member 20 is connected to the vibrating unit 30. This configuration enables ultrasonic waves emitted from different antinodes of vibration to become in phase with each other, which further improves the directivity of the ultrasonic waves. Accordingly, the ultrasonic waves emitted can maintain a high sound pressure for a relatively long distance.

As illustrated in FIGS. 10 and 11, the entire second surface 32 of the vibrating unit 30 is formed concavely so that the peripheral portion of the second surface 32 protrudes more than the central portion. This configuration enables the ultrasonic waves generated by the vibrating unit 30 to converge into a focus.

As illustrated in FIGS. 1 and 4, the vibrating unit 30 includes the flat plate 40 and the directing member 50, and the directing member 50 that is attached to the flat plate 40 is formed of the protrusions and depressions on the second surface 32. In other words, the directing member 50 is formed as a body separated from the flat plate 40, and accordingly the directing member 50 and the flat plate 40 can be made of different materials. The flat plate 40 that vibrates so as to generate multiple circular nodes of vibration can be made of a metallic material such as aluminum to obtain strength, whereas the directing member 50 that follows the vibration of the flat plate 40 can be made of a resin material to reduce the weight. This configuration reduces the influence of the directing member 50 on the vibration characteristics of the vibrating unit 30.

In an example of the embodiment illustrated in FIG. 7, it is described that the convex rings 51 and 52 are attached to the flat plate 40 at the odd number antinode positions when the central portion of the vibrating unit 30 connected to the connection member 20 is numbered one. The same effect of phase shifting of ultrasonic waves as described above can be obtained as far as the protrusions are formed at alternate antinode positions on the second surface 32 of the vibrating unit 30. Accordingly, the protrusions can be formed on the second surface 32 of the vibrating unit 30 at the even number antinode positions when the antinodes are numbered from the antinode position at which the connection member 20 is connected to the vibrating unit 30.

In general, it is noted that the configurations described in the above embodiment may be combined with one another if such combination is technically feasible.

According to exemplary aspects, the ultrasonic wave generation device according to the present disclosure can be applied, for example, to a parametric speaker that selectively produces a sound in a limited area or to the mid-air haptics that generates haptic sensations in the air.

REFERENCE SIGNS LIST 1 ultrasonic wave generation device
10 drive unit
11 piezoelectric member
12, 13 electrode
14 support plate
20 connection member
30 vibrating unit
31 first surface
32 second surface
40 flat plate
50 directing member
51, 52 convex ring
53 concave portion
54 stepped portion

The invention claimed is:

1. An ultrasonic wave generation device, comprising:
a drive unit having a piezoelectric member and an electrode disposed on a surface of the piezoelectric member and that is constructed to entirely vibrate flexurally;
a connection member connected to a portion of the drive unit that includes a point of maximum displacement of the drive unit when the drive unit is subjected to flexural vibration; and
a vibrating unit connected to the connection member and constructed to generate ultrasonic waves when the vibrating unit vibrates due to the flexural vibration transmitted by the connection member.

2. The ultrasonic wave generation device according to claim 1,
wherein the vibrating unit has a first surface connected to the connection member and a second surface positioned opposite to the first surface, and
wherein protrusions and depressions are formed concentrically at the second surface.

3. The ultrasonic wave generation device according to claim 2, wherein the protrusions are disposed at the second surface at even number antinode positions or odd number antinode positions when antinodes are numbered from an antinode position at which the connection member is connected to the vibrating unit.

4. The ultrasonic wave generation device according to claim 2, wherein an entirety of the second surface is shaped concavely with a peripheral portion of the second surface protruding more than a central portion thereof.

5. The ultrasonic wave generation device according to claim 2, wherein the vibrating unit comprises a flat plate and a directing member configured as a body separated from the flat plate.

6. The ultrasonic wave generation device according to claim 5, wherein the directing member attached to the flat plate forms the protrusions and depressions.

7. The ultrasonic wave generation device according to claim 5, wherein the flat plate has a disc-like shape and the directing member is formed from a plurality of convex rings that define the protrusions and depressions.

8. The ultrasonic wave generation device according to claim 7, wherein the convex rings are configured as the protrusions and respective portions of a surface of the flat plate where the convex rings are not disposed are configured as the depressions.

9. The ultrasonic wave generation device according to claim 7, wherein the plurality of convex rings have a height protruding from the flat plate that is approximately a half-wavelength of the ultrasonic waves generated by the vibrating unit.

10. The ultrasonic wave generation device according to claim 5, wherein the flat plate comprises a metallic material and is constructed to vibrate to generate multiple circular nodes of vibration, and the directing member comprises a resin material.

11. The ultrasonic wave generation device according to claim 1, wherein the connection member entirely overlaps the drive unit.

12. The ultrasonic wave generation device according to claim 1, wherein the drive unit comprises a rectangular shape and the portion of the drive unit connected to the connection member includes a point at which two diagonals of the rectangular shape of the drive unit intersect each other.

13. The ultrasonic wave generation device according to claim 1, wherein the connection member comprises a length that is greater than a half of an amplitude of vibration of the vibrating unit to which the flexural vibration of the drive unit is transmitted by the connection member.

14. The ultrasonic wave generation device according to claim 7, wherein the plurality of convex rings comprise a width in a radial direction of the flat plate that are equal to or less than a distance between adjacent nodes of vibration of the flat plate.

15. An ultrasonic wave generation device, comprising:
a drive unit constructed to flexurally vibrate;
a connection member connected to a point of maximum displacement of the drive unit when the drive unit flexurally vibrates; and
a vibrating unit connected to the connection member and constructed to generate ultrasonic waves in response to flexural vibrations transmitted by the connection member when the drive unit flexurally vibrates.

16. The ultrasonic wave generation device according to claim 15, wherein the drive unit includes a piezoelectric member and an electrode disposed on a surface of the piezoelectric member.

17. The ultrasonic wave generation device according to claim 15,
wherein the vibrating unit has a first surface connected to the connection member and a second surface positioned opposite to the first surface, and
wherein protrusions and depressions are formed concentrically at the second surface.

18. The ultrasonic wave generation device according to claim 17, wherein the protrusions are disposed at the second surface at even number antinode positions or odd number antinode positions when antinodes are numbered from an antinode position at which the connection member is connected to the vibrating unit.

19. The ultrasonic wave generation device according to claim 17, wherein an entirety of the second surface is shaped concavely with a peripheral portion of the second surface protruding more than a central portion thereof.

20. The ultrasonic wave generation device according to claim 17,
wherein the vibrating unit comprises a flat plate and a directing member configured as a body separated from the flat plate, and
wherein the directing member attached to the flat plate forms the protrusions and depressions.

* * * * *